(12) United States Patent
DeLuca et al.

(10) Patent No.: US 11,797,945 B2
(45) Date of Patent: Oct. 24, 2023

(54) ENGAGEMENT VIA INTERNET OF THINGS

(71) Applicant: International Business Machines Corporation, Armonk, NY (US)

(72) Inventors: Lisa Seacat DeLuca, Bozeman, MT (US); Michael Domitrovits, New Paltz, NY (US)

(73) Assignee: International Business Machines Corporation, Armonk, NY (US)

( * ) Notice: Subject to any disclaimer, the term of this patent is extended or adjusted under 35 U.S.C. 154(b) by 216 days.

(21) Appl. No.: 17/124,880

(22) Filed: Dec. 17, 2020

(65) Prior Publication Data
US 2022/0199268 A1    Jun. 23, 2022

(51) Int. Cl.
*G06Q 10/109* (2023.01)
*G16Y 40/35* (2020.01)
*H04W 84/18* (2009.01)
*G16Y 40/20* (2020.01)
*G16Y 40/10* (2020.01)
*G06F 30/13* (2020.01)

(52) U.S. Cl.
CPC ............ *G06Q 10/109* (2013.01); *G16Y 40/10* (2020.01); *G16Y 40/20* (2020.01); *G16Y 40/35* (2020.01); *H04W 84/18* (2013.01); *G06F 30/13* (2020.01)

(58) Field of Classification Search
CPC ...... G06Q 10/109; G16Y 40/10; G16Y 40/20; G16Y 40/35; H04W 84/18; G06F 30/13
See application file for complete search history.

(56) References Cited

U.S. PATENT DOCUMENTS

| 8,886,128 | B2 | 11/2014 | Hubner |
| 9,215,258 | B2 | 12/2015 | Kaminsky |
| 10,506,054 | B2 | 12/2019 | Grohman |
| 2006/0224427 | A1 | 10/2006 | Salmon |
| 2011/0047237 | A1 | 2/2011 | Walsh |
| 2011/0179064 | A1 | 7/2011 | Russo |
| 2016/0358126 | A1* | 12/2016 | Bostick ............. G06Q 10/1095 |
| 2018/0107793 | A1* | 4/2018 | Ni ......................... G16H 10/60 |

FOREIGN PATENT DOCUMENTS

WO   2010129188 A2   11/2010

OTHER PUBLICATIONS

Duffin, Erin, Full-time employees—unadjusted monthly number in the U.S. Sep. 2020, Oct. 5, 2020, 2 pages, <https://www.statista.com/statistics/192361/unadjusted-monthly-number-of-full-time-employees-in-the-us/>.

Novikova et al., "The Motif-Based Approach to the Analysis of the Employee Trajectories within Organization", Hindawi, vol. 2018, Article ID 2476968, 13 pages, <https://doi.org/10.1155/2018/2476968>.

"A surprising way to cut real estate costs", JLL, Sep. 25, 2016, 5 pages, <https://www.us.jll.com/en/trends-and-insights/workplace/a-surprising-way-to-cut-real-estate-costs>.

Johnson Hess, Abigail, "People who work from home earn more than those who commute—here's why", Published Sun, Oct. 13, 2019, 6 pages <https://www.cnbc.com/2019/10/13/people-who-work-from-home-earn-more-than-those who-commuteheres-why.html>.

\* cited by examiner

*Primary Examiner* — Michael A Keller

(74) *Attorney, Agent, or Firm* — Nicholas A. Welling

(57) ABSTRACT

Received information associated with interactions of a group are analyzed. Based on the analyzed received information, an engagement opportunity between at least two people from the group is determined.

17 Claims, 5 Drawing Sheets

ENGAGEMENT VIA INTERNET OF THINGS

BACKGROUND

The present invention relates generally to the field of Internet of things (IoT) sensors in the workplace, and more particularly to improving person-to-person engagement via IoT sensors.

Most company employees work at a location other than their personal homes. These locations include places such as office buildings, factories, school (e.g., grade school, high school, college/university) campuses, restaurants, transportation hubs, and the like. With the growth of the IoT in recent years, many of the work locations are equipped with various types of sensors including, but not limited to, occupancy sensors, cameras, badge readers, "Wi-Fi" (wireless fidelity) identifiers, mobile device proximity sensors, and weather related sensors. The data collected by all of these sensors, used both independently and in combination, can provide many insights, some known, others unknown, into the employee workplace.

SUMMARY OF THE INVENTION

Embodiments of the present invention include an approach for improving person-to-person engagement via IoT sensors. In one embodiment, received information associated with interactions of a group are analyzed. Based on the analyzed received information, an engagement opportunity between at least two people from the group is determined.

DETAILED DESCRIPTION

Figure 1:
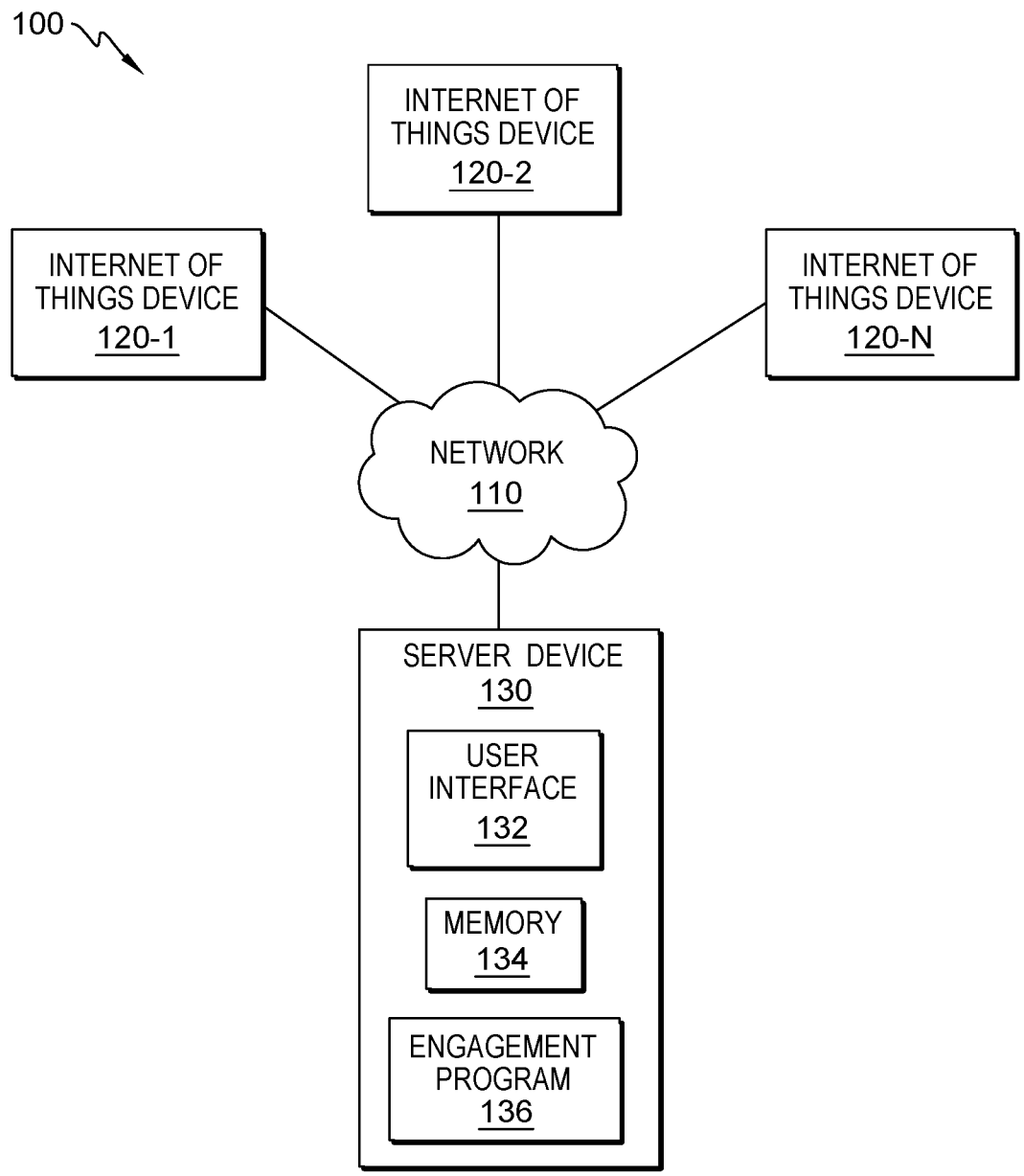
FIG. 1 depicts a functional block diagram illustrating a computing environment which includes an engagement program, in accordance with an embodiment of the present invention.

Embodiments of the present invention recognize that employees in a workplace are busier than ever with more and more responsibilities required of them. Because of the hectic nature of many workplaces, problems can arise without the realization of management and employees; problems such as a manager not spending enough time with one or more employees or a new employee not integrating well with the established employee group. A system is needed that identifies engagement opportunities between people through the use of Internet of things (IoT) sensors.

Embodiments of the present invention recognize that there may be a method, computer program product, and computer system for improving person-to-person engagement via IoT sensors. The method, computer program product, and computer system improve the technology of "workplace" (e.g., an office area, a manufacturing floor, a classroom, etc.) monitoring which functions to create safer spaces for employees, focuses on employee well-being, and to control costs associated with the workplace. Thus, this improvement describes the novelty of the present invention, that being the improvement of the overall workplace experience for all of the people in the workplace. A benefit of this improved technology is fast identification of engagement opportunities between people, for example, a manager and a new employee where the manager is meeting less with the new employee (i.e., not spending enough time with the new employee) compared to the other employees in the department. Another benefit which results from the improved workplace experience is the determination and performing of an action to prevent the situation that caused the identification of the engagement opportunity (e.g., suggesting a weekly meeting between the manager and the new employee and creating/transmitting a relevant meeting notice for the manager and the new employee).

In an embodiment, a group of people is identified. In the embodiment, data associated with the group of people is both received and retrieved. Further in the embodiment, the movements of the group of people are monitored by a set of IoT sensors; the group of people having opted-in to utilize the method, computer program product, and computer system. Further yet in the embodiment, available information about the group of people is analyzed. Further yet in the embodiment, a determination is made whether an engagement opportunity between two or more people in the group of people is identified. Further yet in the embodiment, in response to identifying an engagement opportunity, at least one action is determined. Further yet in the embodiment, a report is created and transmitted. Further yet in the embodiment, the at least one action is performed.

References in the specification to "one embodiment", "an embodiment", "an example embodiment", etc., indicate that the embodiment described may include a particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The present invention will now be described in detail with reference to the Figures.

FIG. 1 is a functional block diagram illustrating a computing environment, generally designated 100, in accordance with one embodiment of the present invention. FIG. 1 provides only an illustration of one implementation of the present invention and does not imply any limitations with regard to the systems and environments in which different embodiments may be implemented. Many modifications to the depicted embodiment may be made by those skilled in the art without departing from the scope of the invention as recited by the claims.

In an embodiment, computing environment 100 includes Internet of things (IoT) device 120-1, IoT device 120-2, IoT device 120-N, and server device 130 interconnected by network 110. In example embodiments, computing environment 100 includes other computing devices (not shown in FIG. 1) such as additional wearable technology, cell phones, smartphones, phablets, tablet computers, laptop computers, desktop computers, other computer servers, or any other computer system known in the art, interconnected with IoT device 120-1, IoT device 120-2, IoT device 120-N, and server device 130 over network 110. For ease of reading, IoT device 120-N will be used to represent any instance of an IoT device (e.g., IoT device 120-1, IoT device 120-2, and any other IoT devices).

In embodiments of the present invention, IoT device 120-N and server device 130 are connected to network 110, which enables IoT device 120-N and server device 130 to access other computing devices and/or data not directly stored on IoT device 120-N and server device 130. Network 110 may be, for example, a short-range, low power wireless connection, a local area network (LAN), a telecommunications network, a wide area network (WAN) such as the Internet, or any combination of the four, and include wired, wireless, or fiber optic connections. Network 110 includes one or more wired and/or wireless networks that are capable of receiving and transmitting data, voice, and/or video signals, including multimedia signals that include voice, data, and video information. In general, network 110 is any combination of connections and protocols that will support communications between IoT device 120-N, server device 130, and any other computing devices (not shown in FIG. 1) connected to network 110, in accordance with embodiments of the present invention.

According to embodiments of the present invention, IoT device 120-N is a computing device in a system of interrelated computing devices that are provided with unique identifiers (UIDs) and the ability to transmit and receive data over a network without requiring human-to-human or human-to-computer interaction. Application uses for IoT device 120-N include, but are not limited to, business, consumer, commercial, industrial, infrastructure, and military applications. In an embodiment, IoT device 120-N is a device used in a business application, or more specifically, a workplace. In the embodiment, examples of IoT device 120-N include, but are not limited to, room occupancy sensors, desk occupancy sensors, cameras (e.g., still photograph and/or video), image sensors, badge readers, proximity sensors, passive infrared (IR) sensors (i.e., motion detectors), temperature sensors, humidity sensors, or any other similar sensor or control used in a workplace such as an employee cafeteria or office area.

In an embodiment of the present invention, server device 130 may be one of a laptop, tablet, or netbook personal computer (PC), a desktop computer, a personal digital assistant (PDA), a smartphone, a standard cell phone, a smartwatch or any other wearable technology, or any other hand-held, programmable electronic device capable of communicating with any other computing device within computing environment 100. According to embodiments, server device 130 can be a standalone computing device, a management server, a web server, a mobile computing device, or any other electronic device or computing system capable of receiving, transmitting, and processing data. In other embodiments, server device 130 can represent computing systems utilizing multiple computers as a server system, such as in a cloud computing environment. In certain embodiments, server device 130 represents a computer system utilizing clustered computers and components (e.g., database server computers, application server computers, etc.) that act as a single pool of seamless resources when accessed by elements of computing environment 100. In general, server device 130 is representative of any electronic device or combination of electronic devices capable of executing computer readable program instructions. In an embodiment, computing environment 100 includes any number of server device 130. Server device 130 may include internal and external hardware components as depicted and described in further detail with respect to FIG. 4, in accordance with embodiments of the present invention. In an embodiment, server device 130 also includes user interface (UI) 132, memory 134, and engagement program 136.

In an embodiment, UI 132 provides an interface between a user of server device 130 and engagement program 136. UI 132 may be a graphical user interface (GUI) or a web user interface (WUI) and can display text, documents, web browser windows, user options, application interfaces, and instructions for operation, and include the information (such as graphic, text, and sound) that a program presents to a user and the control sequences the user employs to control the program. UI 132 may also be mobile application software that provides an interface between server device 130 and engagement program 136. Mobile application software, or an "app," is a computer program designed to run on smartphones, tablet computers and other mobile devices. UI 132 enables a user of server device 130 to interact with IoT device 120-N, engagement program 136, any other programs and applications included on server device 130 (not shown in FIG. 1), and any other computing devices (not shown in FIG. 1).

According to an embodiment, memory 134 is storage that is written to and/or read by engagement program 136, and any other programs and applications on IoT device 120-N and server device 130. In one embodiment, memory 134 resides on server device 130. In other embodiments, memory 134 resides on IoT device 120-N, on any other device (not shown in FIG. 1) in computing environment 100, in cloud storage, or on another computing device accessible via network 110. In yet another embodiment, memory 134 represents multiple storage devices within server device 130. Memory 134 may be implemented using any volatile or non-volatile storage media for storing information, as known in the art. For example, memory 134 may be implemented with a tape library, optical library, one or more independent hard disk drives, multiple hard disk drives in a redundant array of independent disks (RAID), solid-state drives (SSD), or random-access memory (RAM). Similarly, memory 134 may be implemented with any suitable storage architecture known in the art, such as a relational database, an object-oriented database, or one or more tables. In an embodiment of the present invention, IoT device 120-N, engagement program 136, and any other programs and applications (not shown in FIG. 1) operating on server device 130 may store, read, modify, or write data to memory 134. In an embodiment of the present invention, data stored to memory 134 includes, but is not limited to, data received/retrieved/generated by engagement program 136 and data collected by any IoT 120-N.

In an embodiment of the present invention, engagement program 136 is a program, a subprogram of a larger program, an application, a plurality of applications, or mobile application software, which functions to improve person-to-person engagement via IoT (Internet of things) sensors. A program is a sequence of instructions written to perform a specific task. In an embodiment, engagement program 136 runs independently. In other embodiments, engagement program 136 depends on system software and/or other programs (not shown in FIG. 1) to execute. According to an embodiment, engagement program 136 is a cognitive system based on artificial intelligence utilizing machine learning and deep learning which analyzes data received from one or more IoT sensors and identifies engagement opportunities between two or more people based on the data analysis thus improving the workplace experience. In one embodiment, engagement program 136 functions as a stand-alone program residing on server device 130. In another embodiment, engagement program 136 works in conjunction with other programs, applications, etc., found in computing environment 100. In yet another embodiment, engagement program 136 resides on other computing devices such as IoT device 120-N in computing environment 100, which are interconnected to server device 130 via network 110.

According to an embodiment, engagement program 136 identifies a group of people (i.e., a plurality of individuals). In the embodiment, engagement program 136 receives data from IoT device 120-N and retrieves data from other available data sources. Further in the embodiment, engagement program 136 monitors, via IoT device 120-N, the movements of the group of people. Further in the embodiment, engagement program 136 analyzes available information associated with the group of people, including the monitored movements of the group of people. Further in the embodiment, engagement program 136 determines whether an engagement opportunity between two people in the group of people has been identified. Further in the embodiment, in response to identifying an engagement opportunity, engagement program 136 determines an action. Further in the embodiment, engagement program 136 creates a report concerning the engagement opportunity and transmits said report to an appropriate person or persons. Further in the embodiment, engagement program 136 performs the determined action.

Figure 2:
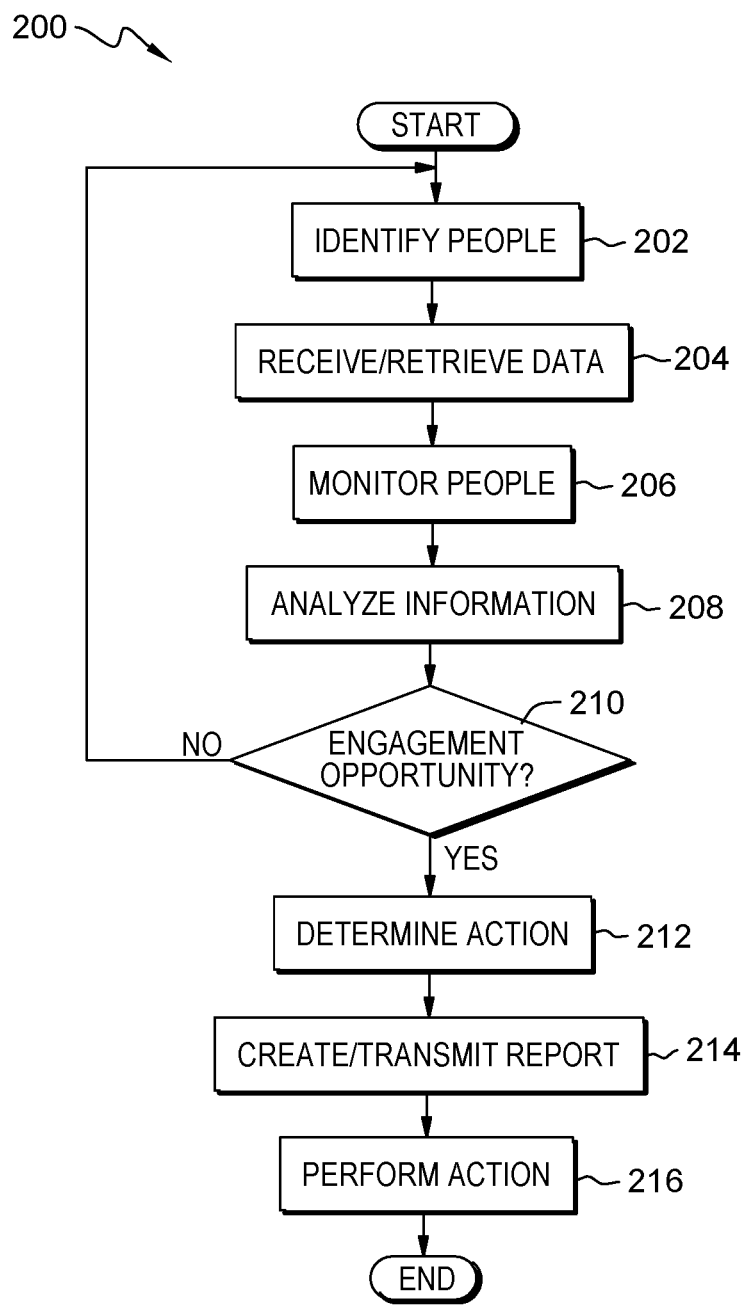
FIG. 2 is a flowchart depicting operational steps of a program for improving person-to-person engagement via IoT sensors, on a computing device within the computing environment of FIG. 1, in accordance with an embodiment of the present invention.

FIG. 2 is a flowchart of workflow 200 depicting operational steps for improving person-to-person engagement via IoT (Internet of things) sensors. In one embodiment, the method of workflow 200 is performed by engagement program 136. In an alternative embodiment, the method of workflow 200 is performed by any other program in computing environment 100 working with engagement program 136. In an embodiment, a user of server device 130 invokes workflow 200 upon accessing engagement program 136. In an alternative embodiment, workflow 200 is dynamically invoked upon IoT device 120-N detecting the presence of a person in an area.

In an embodiment, engagement program 136 identifies people (step 202). In other words, engagement program 136 identifies the people in an area using one or more Internet of things (IoT) sensors (the area being the space which is monitored by the one or more IoT sensors; for example, an office area, a classroom, a manufacturing floor, etc.). According to an embodiment, engagement program 136 may identify one person (e.g., when a person is alone in the given area) or may identify more than one person (e.g., when a group of people are in the given area). Examples of the given area include, but are not limited to, an office building, a cafeteria, a factory, a school (e.g., grade school, high school, college), a restaurant, and the like. IoT sensors used by engagement program 136 to identify people include, but are not limited to, still cameras, video cameras, sensors that measure Wi-Fi (wireless fidelity) signals, voice recognition, employee badge readers, and sensors that detect electromagnetic radiation from electronic devices. Prior to identifying the people, engagement program 136 receives opt-in from the people. Engagement program 136 may utilize various accessible data sources that may include personal data, content, or information the one or more users wish not to be processed. Personal data includes personally identifying information or sensitive personal information as well as user information, such as tracking or geolocation information. Processing refers to any operation, automated or unautomated, or set of operations such as collecting, recording, organizing, structuring, storing, adapting, altering, retrieving, consulting, using, disclosing by transmission, dissemination, or otherwise making available, combining, restricting, erasing, or destroying personal data. Opting-in to use engagement program 136 enables the authorized and secure processing of personal data as well as monitoring the opted-in users' movements and interactions with other opted-in users. Engagement program 136 provides informed consent, with notice of the collection of personal data, allowing the one or more users to opt-in or opt-out of processing personal data. Consent can take several forms. Opt-in consent can impose on a user to take an affirmative action before personal data is processed. Alternatively, opt-out consent can impose on the user to take an affirmative action to prevent the processing of personal data before personal data is processed. Engagement program 136 provides information regarding personal data and the nature (e.g., type, scope, purpose, duration, etc.) of the processing. Engagement program 136 provides the one or more users with copies of stored personal data. Further, engagement program 136 allows for the correction or completion of incorrect or incomplete personal data and also allows for the immediate deletion of personal data. In an embodiment, engagement program 136 identifies the people in a given area using a plurality of IoT device 120-N; in the embodiment, only the people who have opted-in are identified (i.e., a person who has not opted-in is ignored by engagement program 136). For example, a program on a teacher's laptop computer identifies the teacher (e.g., T) and twenty-five students (e.g., S1, S2, S3 . . . S25) in a third grade classroom.

According to an embodiment of the present invention, engagement program 136 receives/retrieves data (step 204). In other words, engagement program 136 receives available data associated with the identified people and also retrieves data associated with the identified people. In an embodiment, types of data received by engagement program 136 includes, but is not limited to, a current date (e.g., day, month, year), a current time, interaction times spent between two or more people included in the identified people, current weather, and the like. Types of data retrieved by engagement program 136 includes, but is not limited to, age, historical performance information, employee information (e.g., role, job title, organization/business unit, seniority level, resume, etc.), and any other information associated with the identified people which is available to engagement program 136. Data received by engagement program 136 is received from computing devices (not shown in FIG. 1) which are connected to network 110. Engagement program 136 retrieves data from computing devices (not shown in FIG. 1) which are connected to network 110. Data received and retrieved by engagement program 136 is stored to memory 134 on server device 130. According to an embodiment, engagement program 136 receives and retrieves data associated with the identified people; said data is stored to memory 134 on server device 130. For example, the program on the teacher's laptop receives data associated with the teacher and with the twenty-five students; student data includes past and current grades as well as attendance records.

In an embodiment, engagement program 136 monitors people (step 206). In other words, engagement program 136 monitors the movements and interactions of the identified group of people. According to an embodiment of the present invention, engagement program 136 monitors the movements and interactions of the identified people using the sensors associated with any number of IoT devices such as cameras, motion detectors, Wi-Fi signal sensors, electromagnetic radiation sensors, voice recognition, and the like. Additional data is collected by engagement program 136 such as date and time of interactions, where an interaction is two or more people getting together for a meeting, discussion, personal visit, etc., people involved in the interactions, and the duration of the interactions. In an embodiment, engagement program 136 monitors the movement and interactions of the identified people via any number of IoT device 120-N and stored data associated with the movement and interactions to memory 134 on server device 130. For example, the program on the teacher's laptop monitors the movements and interactions of the teacher and the twenty-five students. Of specific interest are the individual interactions between the teacher and each of the students (e.g., T and S1, T and S2, etc.).

According to an embodiment, engagement program 136 analyzes information (step 208). In other words, engagement program 136 analyzes the received and retrieved data along with the information collected from monitoring the movements and interactions of the people. In an embodiment, the analysis is done by engagement program 136 in order to determine patterns and anomalies within the data. For example, a manager may meet, on average, with each of the department employees for one hour each month. However, one employee meet with the manager for only fifteen minutes per month. Engagement program 136 would analyze the movement/interaction data of the manager and the employees and identify this anomaly. Further, engagement program 136 would recommend to the manager an action to resolve the anomaly. Any analytical techniques known in the art may be used by engagement program 136 in the analysis of the data and information. Results of the analysis may include determinations such as (i) a manager meets with each department employee for one hour each quarter during the first week of the quarter, (ii) a designer and an engineer may meet, on average, for sixty to ninety minutes every week to review program status, (iii) three friends may meet for coffee each Wednesday morning at 8:30 AM for a duration of forty-five minutes, and (iv) a teacher may spend, on average, thirty minutes with each student over a month's time. There are any number of other determinations that may be made by engagement program 136 during the analysis of the data and the information. According to an embodiment, engagement program 136 analyzes the data received from IoT device 120-N, the retrieved data, and the information collected from monitoring the movements and interactions of the identified people. For example, the program on the teacher's laptop analyzes the information associated with the teacher and the twenty-five students.

In an embodiment, engagement program 136 determines whether an engagement opportunity is identified (decision step 210). In other words, engagement program 136 determines, based on the analysis of the information, whether an engagement opportunity exists between at least two people within the identified people. According to an embodiment of the present invention, engagement opportunities that may be identified include, but are not limited to, people who should spend more, or less, time together; people in specific job roles that should spend more, or less, time together; disproportional time spent (e.g., between a manger and each employee in a department); groups that should spend more, or less, time together; meetings that occur too often (or not enough); durations of meetings; and effectiveness of space (i.e. floorplan) design. For each of these opportunities, preferences may be set at the level of the individual people, a team (or group) of people, the manager of a group of people, the business unit, and the company. For example, because of the importance of a project, the project team should meet twice/week rather than weekly. A negative opportunity may be that two friends from different business units (i.e., their respective assignments do not overlap) should not meet daily for coffee. In one embodiment (decision step 210, NO branch), engagement program 136 determines that there is no engagement opportunity identified; therefore, engagement program 136 returns to step 202 to continue identifying people. In the embodiment (decision step 210, YES branch), engagement program 136 determines that an engagement opportunity exists; therefore, engagement program 136 proceeds to step 212 to determine at least on action.

According to an embodiment, engagement program 136 determines action (step 212). In other words, responsive to determining that an engagement opportunity has been identified, engagement program 136 determines at least one action based on the identified engagement opportunity. In an embodiment, actions determined by engagement program 136 may include, but are not limited to, a recommendation that two or more people spend less, or more, time together; a recommendation that people in specific job roles should spend less, or more, time together; a recommendation to adjust disproportionate time spent by a manager & the manager's employees; a recommendation that groups of people spend less, or more time together; a recommendation for meetings between groups of people occur more or less frequently; a recommendation to change the duration of a meeting; a recommendation to alter a floorplan (e.g., move the design team closer to the engineering team); and a recommendation to resolve unconscious bias identified between two people. In an embodiment, engagement program 136 determines at least one action based on the identified engagement opportunity determined from the analyzed information. For example, the program on the teacher's laptop determines that the teacher is not spending comparable time with students S4, S13, and S20 as compared to the remaining students. Further, when cross-referencing the grades of students S4, S13, and S20, the program determines that said students require additional assistance from a math grade perspective. Accordingly, the program determines the action that the teacher should spend more time with those three students as well as concentrating on their math studies.

In an embodiment, engagement program 136 creates/transmits report (step 214). In other words, engagement program 136 documents the engagement opportunity and the associated determined action by first creating a report which outlines the information used to determine the engagement opportunity and subsequently transmitting the created report to the appropriate individual(s). According to an embodiment, engagement program 136 also stores the report to memory. Content included in the created report may include, but is not limited to, the determined action, the analysis of the data and movement/interaction information used to identify the engagement opportunity, and the actual data and movement/interaction information. Engagement program 136 creates and transmits the report via any technology known in the art. Examples of methods to create and transmit the report include, but are not limited to, create the report in a word processing tool and e-mail the report, create an audible report and text a file of the audible report to one or more smartphones, and create the report in a portable document format (PDF) file using a standard form and printing the completed form to a printer associated with the appropriate individual(s). In an embodiment, engagement program 136 creates a report documenting the determined action and transmits the created report over network 110 to the appropriate individual(s). For example, the program on the teacher's laptop creates a report document the data used to determine that the teacher has not spent sufficient time with students S4, S13, and S20. The program e-mails a copy of the report to the teacher and stores the report to a database on the laptop. Further, the program recommends that the teacher spend an additional twenty minutes twice a week with each student. To accomplish this recommendation, the program reviews the schedules of the four parties and determines the following: (i) the teacher should ask student S4 to meet on Tuesday and Friday mornings at 8:10 AM as neither starts class until 8:30 AM and the student arrives at 8:00 AM daily based on the bus schedule, and (ii) the teach should ask students S13 and S20 to return to the classroom at 2:00 PM daily as that is the teacher's free hour during the day and both students have study hall at that time. Further yet, the program suggests that the teacher ask for the approval of student S4's parents as meeting before class would not be mandatory for the student.

According to an embodiment of the present invention, engagement program 136 performs action (step 216). In other words, responsive to determining at least one action and creating/transmitting a report associated with said at least one action, engagement program 136 performs the action to the extent possible. In an embodiment, based on the determined engagement opportunity, engagement program 136 may review schedules for two or more people associated with the engagement opportunity, create (i.e., initiate) a meeting notice in the calendar of one of the two or more people associated with the engagement opportunity, pre-populate one or more fields in the created meeting notice, and transmit the completed meeting notice upon an indication from the individual for whom the meeting notice is created. For example, if engagement program 136 determines that two co-workers are spending too much time daily in the breakroom, engagement program 136 may first send an e-mail to each of the co-workers to limit their time in the breakroom. If the meetings continue for a period of time, engagement program 136 may send a notification to each co-worker's manager documenting the behavior. Technologies known in the art are used by engagement program 136 to perform the determined action. According to an embodiment, engagement program 136 performs the determined action. For example, the program on the teacher's laptop (i) updates the teacher's schedule for the recommended meetings, (ii) adds a reminder on the teacher's calendar to ask the students to spend the additional time with the teacher, and (iii) sends an e-mail to the parents of student S4 requesting their approval for meeting an additional twenty minutes twice/week.

The following paragraphs discuss briefly some other embodiments where engagement program 136 may be useful.

In a first embodiment, instead of individual to individual, engagement program 136 may be applicable with group to group interactions. For example, a preference may be input to engagement program 136 that the research department meet monthly with the engineering department to update the engineering department concerning the on-going work in research. Engagement program 136 may monitor the two departments to ensure that the monthly meeting occurs.

In a second embodiment, person to person interactions (particularly manager to employee) may be cross-referenced by engagement program 136 with other available data (e.g., employee performance data, other performance metrics) to potentially identify other influences that time may have on business outcome. For example, if engagement program 136 determines that three co-workers spend time together that is above a threshold time, engagement program 136 may review performance metrics of the three co-workers and determine that as a group, the three have been submitting three invention disclosures per month, well above the company average of one per quarter per person.

In a third embodiment, engagement program 136 may be integrated with electronic meeting applications to determine engagement opportunities. For example, engagement program 136 may identify that two people from two different companies working together on a project meet virtually on a regular basis. Further, engagement program 136 may determine that the two people live in neighboring cities (unbeknownst to them); accordingly, engagement program 136 may recommend that the two meet face to face for some of their meetings at a mutually convenient location.

In a fourth embodiment, engagement program 136 may be integrated into wearable devices to monitor the interactions of employees that work remotely rather than in the company office building. For example, when integrated into a smartwatch, engagement program 136 may determine that a salesman is visiting the offices of potential customers and not visiting other, non-business related, locations.

Figure 3A:
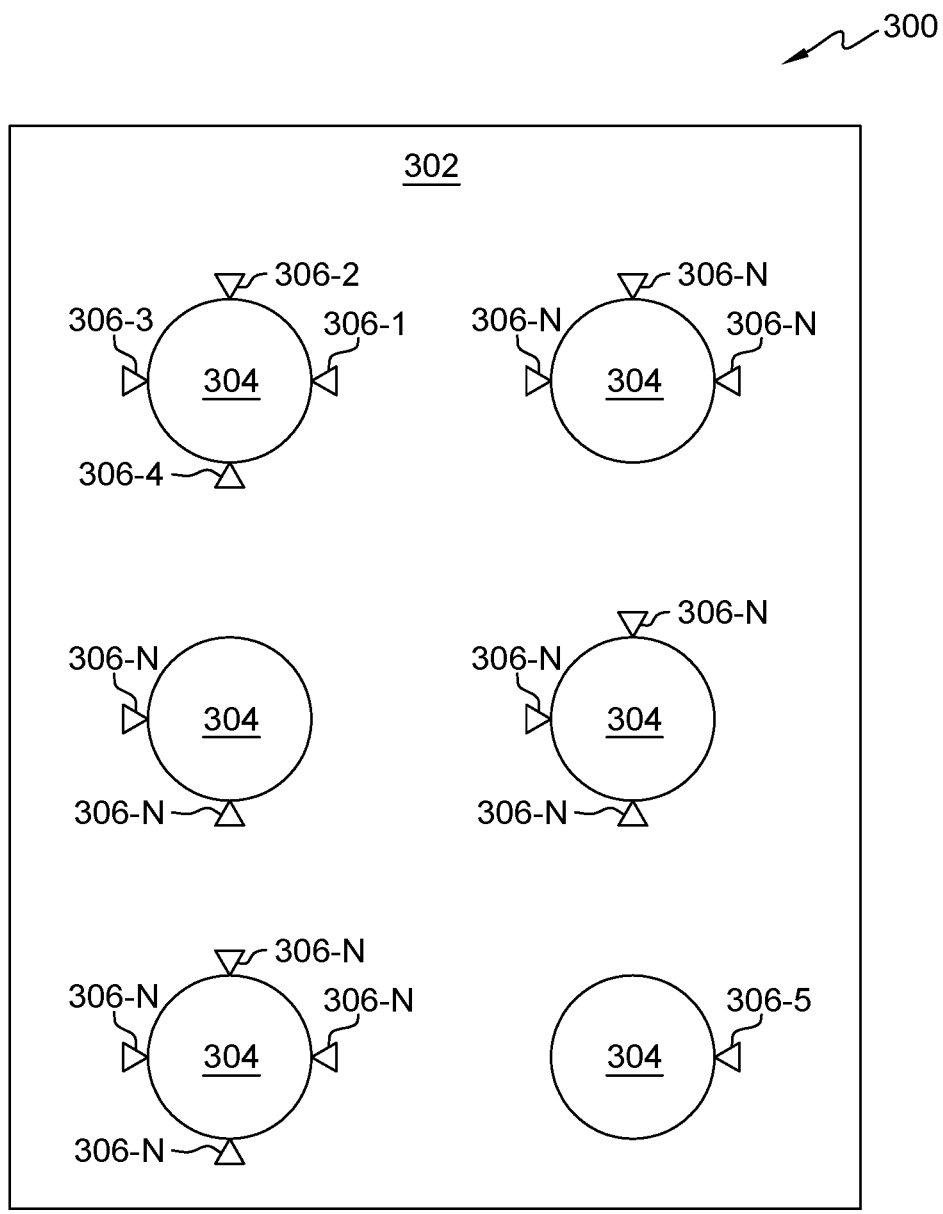
FIG. 3A depicts an example cafeteria setting occupied by a number of employees, in accordance with an embodiment of the present invention.

FIG. 3A depicts example 300 of a group of six tables in a cafeteria, according to one embodiment of the present invention. Example 300 includes area 302 in the cafeteria, tables 304, 'Ann' 306-1, 'Bill' 306-2, Tat' 306-3, 'Don' 306-4, 'Ed' 306-5 and other people 306-N. 'Ann' 306-1, 'Bill' 306-2, Tat' 306-3, 'Don' 306-4, and 'Ed' 306-5 all work in the same department at their company. Engagement program 136 is able to determine, based on data from IoT device 120-N, that this is the same seating arrangement for 'Ann' 306-1, 'Bill' 306-2, 'Cat' 306-3, 'Don' 306-4, and 'Ed' 306-5 for approximately eighty-seven percent (87%) of the time for the last full quarter of the calendar (i.e., the last three full months). Based on this determination, engagement program 136 is able to make the following recommendations: (i) engagement program 136 recommends to each of 'Ann' 306-1, 'Bill' 306-2, 'Cat' 306-3, 'Don' 306-4 to include 'Ed' 306-5 during their lunch gathering, (ii) engagement program 136 recommends to 'Ed' 306-5 to be more assertive and to ask his co-workers if he can join them for lunch, and (iii) engagement program 136 recommends that the manager of the five co-workers investigate whether there is an issue between the four co-workers (i.e., 'Ann' 306-1, 'Bill' 306-2, 'Cat' 306-3, 'Don' 306-4) and 'Ed' 306-5 based on their sitting apart at lunch.

Figure 3B:
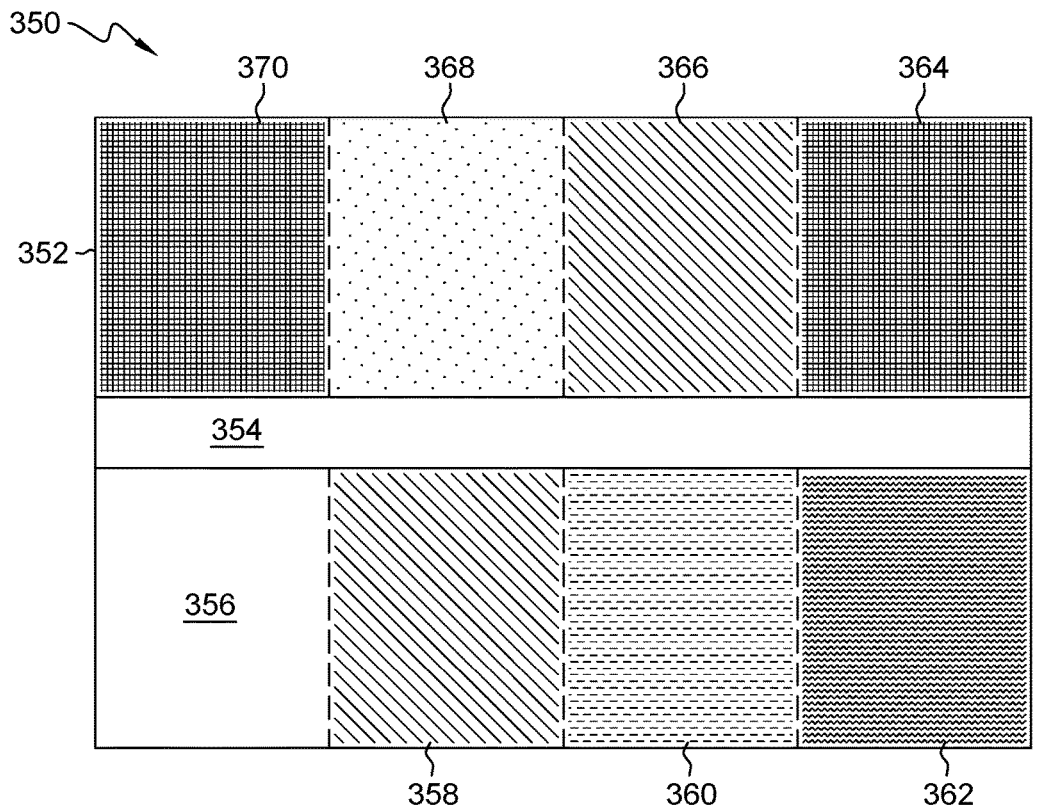
FIG. 3B depicts an example heat map of office cubicles, where the heat map indicates the interactions between a manager and various employees, in accordance with an embodiment of the present invention.

FIG. 3B depicts example 350 of a heat map of office cubicles, where the heat map indicates the interactions between a manager and various employees, according to one embodiment of the present invention. Example 350 includes office area 352, aisle 354, office 356 (used by 'Maeve', the manager), office 358 (used by 'Richard'), office 360 (used by 'Jeannine'), office 362 (used by 'Grover'), office 364 (used by 'Howard'), office 366 (used by 'Mary'), office 368 (used by 'Leah'), and office 370 (used by 'Allen'). The heat map, overlaid on office area 352, represents the amount of interactions between 'Maeve' and the various employees who occupy the remaining seven offices over the last three months. The lighter the shading, the fewer the interactions. Conversely, the darker the shading, the greater the interactions. Thus, the heat map indicates that 'Maeve' has met the most with 'Jeannine' (who uses office 360) and has met the least with 'Leah' (who uses office 368). To ensure that 'Leah' is not being neglected, engagement program 136 determines an action which is described below by example 370 in FIG. 3C.

Figure 3C:
FIG. 3C depicts a dynamically generated recommendation, including a meeting notice, created by the engagement program, in accordance with an embodiment of the present invention.

FIG. 3C depicts example 370 of a dynamically determined/generated action based on an analysis of the heat map of office cubicle in example 350 by engagement program 136. Example 370 includes action 372, which includes recommendation 374 and meeting notice 376. Based on the finding by engagement program 136 that 'Maeve' has spent much less time with 'Leah' over the last three months, engagement program 136 generates an action which includes (i) a recommendation that 'Maeve' and 'Leah' have a one-on-one meeting (i.e., recommendation 374) and (ii) creating and pre-populating a calendar meeting notice for 'Maeve' to send to 'Leah' for a half-hour meeting (i.e., meeting notice 376). As a part of pre-populating the meeting notice with a day and time for the meeting, engagement program 136 retrieves the personal calendars for each of 'Maeve' and 'Leah' to find an open time slot for the meeting for both parties. 'Maeve' has the option to send the meeting notice as-is, to save the meeting notice as a draft, to cancel the meeting notice, or to edit aspects of the meeting notice and subsequently send (e.g., 'Maeve' may opt to make the meeting a repeating meeting on a monthly basis).

Figure 4:
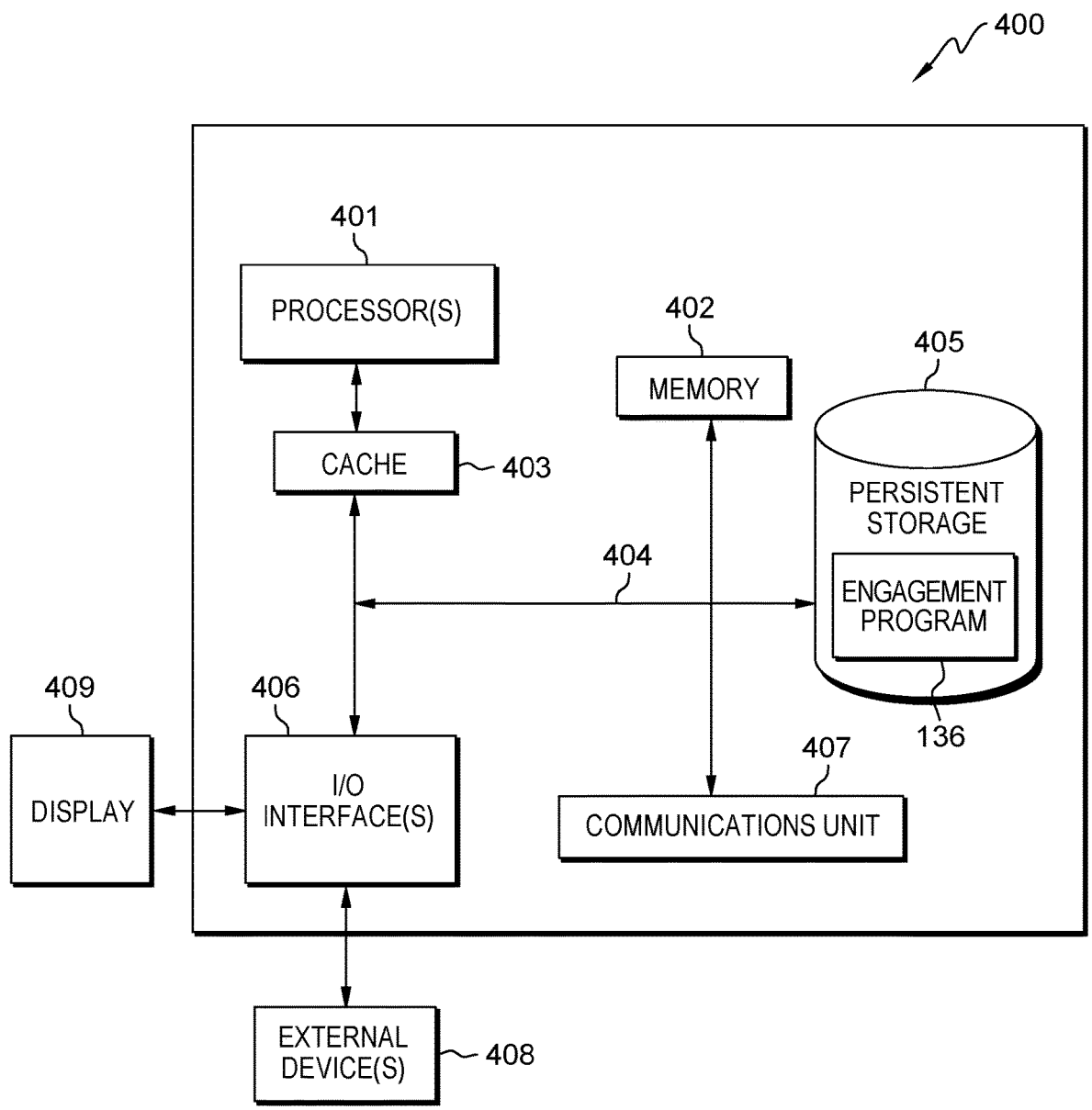
FIG. 4 depicts a block diagram of components of a computing device executing an engagement program within the computing environment of FIG. 1, in accordance with an embodiment of the present invention.

FIG. 4 depicts computer system 400, which is an example of a system that includes engagement program 136. Computer system 400 includes processors 401, cache 403, memory 402, persistent storage 405, communications unit 407, input/output (I/O) interface(s) 406 and communications fabric 404. Communications fabric 404 provides communications between cache 403, memory 402, persistent storage 405, communications unit 407, and input/output (I/O) interface(s) 406. Communications fabric 404 can be implemented with any architecture designed for passing data and/or control information between processors (such as microprocessors, communications and network processors, etc.), system memory, peripheral devices, and any other hardware components within a system. For example, communications fabric 404 can be implemented with one or more buses or a crossbar switch.

Memory 402 and persistent storage 405 are computer readable storage media. In this embodiment, memory 402 includes random access memory (RAM). In general, memory 402 can include any suitable volatile or non-volatile computer readable storage media. Cache 403 is a fast memory that enhances the performance of processors 401 by holding recently accessed data, and data near recently accessed data, from memory 402.

Program instructions and data used to practice embodiments of the present invention may be stored in persistent storage 405 and in memory 402 for execution by one or more of the respective processors 401 via cache 403. In an embodiment, persistent storage 405 includes a magnetic hard disk drive. Alternatively, or in addition to a magnetic hard disk drive, persistent storage 405 can include a solid-state hard drive, a semiconductor storage device, read-only memory (ROM), erasable programmable read-only memory (EPROM), flash memory, or any other computer readable storage media that is capable of storing program instructions or digital information.

The media used by persistent storage 405 may also be removable. For example, a removable hard drive may be used for persistent storage 405. Other examples include optical and magnetic disks, thumb drives, and smart cards that are inserted into a drive for transfer onto another computer readable storage medium that is also part of persistent storage 405.

Communications unit 407, in these examples, provides for communications with other data processing systems or devices. In these examples, communications unit 407 includes one or more network interface cards. Communications unit 407 may provide communications through the use of either or both physical and wireless communications links. Program instructions and data used to practice embodiments of the present invention may be downloaded to persistent storage 405 through communications unit 407.

I/O interface(s) 406 allows for input and output of data with other devices that may be connected to each computer system. For example, I/O interface 406 may provide a connection to external devices 408 such as a keyboard, keypad, a touch screen, and/or some other suitable input device. External devices 408 can also include portable computer readable storage media such as, for example, thumb drives, portable optical or magnetic disks, and memory cards. Software and data used to practice embodiments of the present invention can be stored on such portable computer readable storage media and can be loaded onto persistent storage 405 via I/O interface(s) 406. I/O interface(s) 406 also connect to display 409.

Display 409 provides a mechanism to display data to a user and may be, for example, a computer monitor.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

What is claimed is:

1. A method, the method comprising:
analyzing, by one or more computer processors, received information associated with interactions of a group;
identifying, by one or more computer processors, each person in the group who has opted-in to being identified;
receiving, by one or more computer processors, a first set of data associated with each identified person who has opted-in, wherein the first set of data comprises a current date, a current time, a current weather, and interaction times spent between two or more opted-in people in the group, wherein the first set of data is from one or more internet of things devices;
retrieving, by one or more computer processors, a second set of data associated with each identified person who has opted-in, wherein the second set of data is from one or more internet of things devices;
analyzing, by one or more computer processors, the first set of data, the second set of data, and the received information associated with the interactions of the group to determine the engagement opportunity, wherein the analyzing is based on a cognitive system associated with the one or more internet of things devices; and
determining, by one or more computer processors, an engagement opportunity between at least two people from the group based on the analyzed received information.

2. The method of claim 1, wherein an engagement opportunity includes one or more of a first set of people who should spend more, or less, time together; a second set of people in specific job roles that should spend more, or less, time together; a determination of disproportional time spent between at least two people; one or more groups that should spend more, or less, time together; a determination of durations of meetings; and an effectiveness of floorplan space design.

3. The method of claim 1, further comprising:
responsive to determining the engagement opportunity, determining, by one or more computer processors, at least one action based on the determined engagement opportunity;
creating, by one or more computer processors, a report based on the determined engagement opportunity and the determined at least one action;
transmitting, by one or more computer processors, the created report to at least one person associated with the determined engagement opportunity; and
performing, by one or more computer processors, the determined at least one action.

4. The method of claim 3, wherein the at least one action includes one or more of a recommendation that two or more people spend less, or more, time together; a recommendation that people in specific job roles should spend less, or more, time together; a recommendation to adjust a disproportionate time spent by a manager and an employee of the manager; a recommendation that groups of people spend less, or more time together; a recommendation for meetings between groups of people occur more or less frequently; a recommendation to change a duration of a meeting; a recommendation to alter a floorplan; and a recommendation to resolve unconscious bias identified between at least two people.

5. The method of claim 3, wherein the step of performing, by one or more computer processors, the determined at least one action, comprises:
reviewing, by one or more computer processors, one or more schedules for two or more people associated with the determined engagement opportunity;
initiating, by one or more computer processors, a meeting notice in a calendar of one person of the two or more people;
prepopulating, by one or more computer processors, one or more fields in the initiated meeting notice; and
responsive to an indication from the one person of the two or more people, transmitting, by one or more computer processors, a completed meeting notice to the two or more people.

6. The method of claim 1, wherein the retrieved second set of data includes one or more of a set of historical performances of the group and employee information associated with the group.

7. The method of claim 1, wherein the group comprises a plurality of individuals.

8. A computer program product, the computer program product comprising:
one or more computer readable storage media; and
program instructions stored on the one or more computer readable storage media, the program instructions comprising instructions to:
analyze received information associated with interactions of a group;
identify each person in the group who has opted-in to being identified;
receive a first set of data associated with each identified person who has opted-in, wherein the first set of data comprises a current date, a current time, a current weather, and interaction times spent between two or more opt-ed in people in the group, wherein the first set of data is from one or more internet of things devices;
retrieve a second set of data associated with each identified person who has opted-in, wherein the second set of data is from one or more internet of things devices;
analyze the first set of data, the second set of data, and the received information associated with the interactions of the group to determine the engagement opportunity, wherein the analyzing is based on a cognitive system associated with the one or more internet of things devices; and
program instructions to determine an engagement opportunity between at least two people from the group based on the analyzed received information.

9. The computer program produce of claim 8, wherein an engagement opportunity includes one or more of a first set of people who should spend more, or less, time together; a second set of people in specific job roles that should spend more, or less, time together; a determination of disproportional time spent between at least two people; one or more groups that should spend more, or less, time together; a determination of durations of meetings; and an effectiveness of floorplan space design.

10. The computer program product of claim 8, further comprising program instructions stored on the one or more computer readable storage media, to:
responsive to determining the engagement opportunity, determine at least one action based on the determined engagement opportunity;
create a report based on the determined engagement opportunity and the determined at least one action;
transmit the created report to at least one person associated with the determined engagement opportunity; and
perform the determined at least one action.

11. The computer program product of claim 10, wherein the at least one action includes one or more of a recommendation that two or more people spend less, or more, time together; a recommendation that people in specific job roles should spend less, or more, time together; a recommendation to adjust a disproportionate time spent by a manager and an employee of the manager; a recommendation that groups of people spend less, or more time together; a recommendation for meetings between groups of people occur more or less frequently; a recommendation to change a duration of a meeting; a recommendation to alter a floorplan; and a recommendation to resolve unconscious bias identified between at least two people.

12. The computer program product of claim 10, wherein the program instructions to perform the determined at least one action, comprises:
program instructions to review one or more schedules for two or more people associated with the determined engagement opportunity;
program instructions to initiate a meeting notice in a calendar of one person of the two or more people;
program instructions to prepopulate one or more fields in the initiated meeting notice; and
responsive to an indication from the one person of the two or more people, program instructions to transmit a completed meeting notice to the two or more people.

13. The computer program product of claim 8, wherein the retrieved second set of data includes one or more of a set of historical performances of the group and employee information associated with the group.

14. The computer program product of claim 8, wherein the group comprises a plurality of individuals.

15. A computer system, the computer system comprising:
one or more computer processors;
one or more computer readable storage media; and
program instructions stored on the one or more computer readable storage media for execution by at least one of the one or more computer processors, comprising instructions to:
analyze received information associated with interactions of a group;
identify each person in the group who has opted-in to being identified;
receive a first set of data associated with each identified person who has opted-in, wherein the first set of data comprises a current date, a current time, a current weather, and interaction times spent between two or more opt-ed in people in the group wherein the first set of data is from one or more internet of things devices;
retrieve a second set of data associated with each identified person who has opted-in, wherein the second set of data is from one or more internet of things devices;
analyze the first set of data, the second set of data, and the received information associated with the interactions of the group to determine the engagement opportunity, wherein the analyzing is based on a cognitive system associated with the one or more internet of things devices; and
program instructions to determine an engagement opportunity between at least two people from the group based on the analyzed received information.

16. The computer system of claim 15, wherein an engagement opportunity includes one or more of a first set of people who should spend more, or less, time together; a second set of people in specific job roles that should spend more, or less, time together; a determination of disproportional time spent between at least two people; one or more groups that should spend more, or less, time together; a determination of durations of meetings; and an effectiveness of floorplan space design.

17. The computer system of claim 15, further comprising program instructions stored on the one or more computer readable storage media for execution by at least one of the one or more computer processors, to: responsive to determining the engagement opportunity, determine at least one action based on the determined engagement opportunity; create a report based on the determined engagement opportunity and the determined at least one action; transmit the created report to at least one person associated with the determined engagement opportunity; and perform the determined at least one action.

* * * * *